United States Patent
Wei

(10) Patent No.: US 11,824,378 B2
(45) Date of Patent: Nov. 21, 2023

(54) METHOD AND DEVICE FOR IDENTIFYING BATTERY, BATTERY, AND STORAGE MEDIUM

(71) Applicant: BEIJING XIAOMI MOBILE SOFTWARE CO., LTD., Beijing (CN)

(72) Inventor: Xuewen Wei, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 474 days.

(21) Appl. No.: 17/127,782

(22) Filed: Dec. 18, 2020

(65) Prior Publication Data

US 2021/0384742 A1    Dec. 9, 2021

(30) Foreign Application Priority Data

Jun. 4, 2020    (CN) .......................... 202010499084.3

(51) Int. Cl.
    *H02J 7/00*           (2006.01)
    *G01R 31/3842*     (2019.01)
    *G01R 31/36*       (2020.01)

(52) U.S. Cl.
    CPC ...... *H02J 7/00038* (2020.01); *G01R 31/3644* (2013.01); *G01R 31/3842* (2019.01); *H02J 7/00036* (2020.01)

(58) Field of Classification Search
    USPC ........................................................ 324/426
    See application file for complete search history.

(56) References Cited

U.S. PATENT DOCUMENTS

| | | | |
|---|---|---|---|
| 6,191,551 B1* | 2/2001 | Fischer | H02J 7/00047 320/110 |
| 10,424,961 B1 | 9/2019 | Maluf et al. | |
| 2005/0162172 A1 | 7/2005 | Bertness | |
| 2012/0169271 A1 | 7/2012 | Ovorkin et al. | |
| 2013/0141033 A1* | 6/2013 | Bak | H02J 7/04 320/106 |
| 2018/0062401 A1 | 3/2018 | Quiambao et al. | |
| 2019/0317156 A1 | 10/2019 | Quiambao et al. | |
| 2020/0014218 A1 | 1/2020 | Maluf et al. | |

FOREIGN PATENT DOCUMENTS

| | | |
|---|---|---|
| CN | 107367699 A | 11/2017 |
| EP | 1065774 A2 | 1/2001 |

OTHER PUBLICATIONS

Extended European Search Report in the European Application No. 21165663.2, dated Jun. 18, 2021, (7p).

* cited by examiner

*Primary Examiner* — Samuel Berhanu
(74) *Attorney, Agent, or Firm* — Arch & Lake LLP

(57) ABSTRACT

Methods, apparatuses, and non-transitory computer-readable storage mediums are provided for identifying a battery. The method may be applied to electronic equipment. The electronic equipment may detect an electrical parameter of a cell under test in the battery of the electronic equipment. The electronic equipment may also determine a similarity between the cell under test and a preset cell according to the electrical parameter, the preset cell meeting a first preset matching relation with the electronic equipment. The electronic equipment may further determine, according to the similarity, whether the cell under test meets the first preset matching relation with the electronic equipment, acquiring a determination result.

16 Claims, 4 Drawing Sheets

METHOD AND DEVICE FOR IDENTIFYING BATTERY, BATTERY, AND STORAGE MEDIUM

CROSS-REFERENCE TO RELATED APPLICATION

This application is based on, and claims the priority of Chinese Application No. 202010499084.3, filed on Jun. 4, 2020, the entire contents of which are incorporated herein by reference in its entirety for all purposes.

TECHNICAL FIELD

The present disclosure relates to the technical field of batteries, and more particularly, to a method, device, and storage medium for identifying a battery.

BACKGROUND

With rapid development of mobile User Equipment (UE), while electronic equipment such as a mobile phone, a tablet computer, etc., may fully meet a requirement of a user in terms of functionality, security of the electronic equipment, such as battery security, becomes particularly important.

Taking a mobile phone as an example, many manufacturers may manufacture and sell imitation batteries. Compared to the original battery, being cheap is the greatest advantage of these imitation batteries. However, use of an imitation battery may damage a motherboard of the mobile phone, or even cause explosion of the battery or the mobile phone, endangering personal safety.

SUMMARY

In view of this, the present disclosure provides a method, device, and storage medium for identifying a battery According to a first aspect of the present disclosure, a method for identifying a battery applied to electronic equipment is provided. The electronic equipment may detect an electrical parameter of a cell under test. The battery may include the cell under test. The electronic equipment may also determine a similarity between the cell under test and a preset cell according to the electrical parameter, the preset cell meeting a first preset matching relation with the electronic equipment. The electronic equipment may further determine, according to the similarity, whether the cell under test meets the first preset matching relation with the electronic equipment, acquiring a determination result.

According to a second aspect of the present disclosure, electronic equipment is provided. The electronic equipment may include one or more processors and a non-transitory computer-readable storage medium storing instructions executable by the one or more processors. The one or more processors may be adapted to identify a battery comprising a cell under test including detecting an electrical parameter of the cell under test. The one or more processors may further be configured to determine a similarity between the cell under test and a preset cell according to the electrical parameter, the preset cell meeting a first preset matching relation with the electronic equipment. The one or more processors may also be configured to determine, according to the similarity, whether the cell under test meets the first preset matching relation with the electronic equipment, acquiring a determination result.

According to a third aspect of the present disclosure, a battery is provided. The battery may include a cell and a battery protecting component. The cell may be adapted to store electric energy. The battery protecting circuit may be adapted to protect the cell. The battery protecting circuit may include a one-time burning counter adapted to determine a count indicating a cycle number of the battery.

According to a fourth aspect of the present disclosure, a non-transitory computer-readable storage medium having a plurality of programs for execution by a computing device having one or more processors are provided. When the plurality of programs are executed by one or more processors of the computing device, the plurality of programs may cause the computing device to detect an electrical parameter of a cell under test. The plurality of programs may further cause the computing device to determine a similarity between the cell under test and a preset cell according to the electrical parameter, the preset cell meeting a first preset matching relation with the electronic equipment. The plurality of programs may further cause the computing device to determine, according to the similarity, whether the cell under test meets the first preset matching relation with the electronic equipment, acquiring a determination result.

The above general description and elaboration below are but examples and explanatory, and do not limit the present disclosure, as claimed.

BRIEF DESCRIPTION OF THE DRAWINGS

The accompanying drawings, which are incorporated in and constitute part of this specification, illustrate embodiments according with the present disclosure, and serve to explain the principle of the present disclosure together with the description.

DETAILED DESCRIPTION

Figure 1:
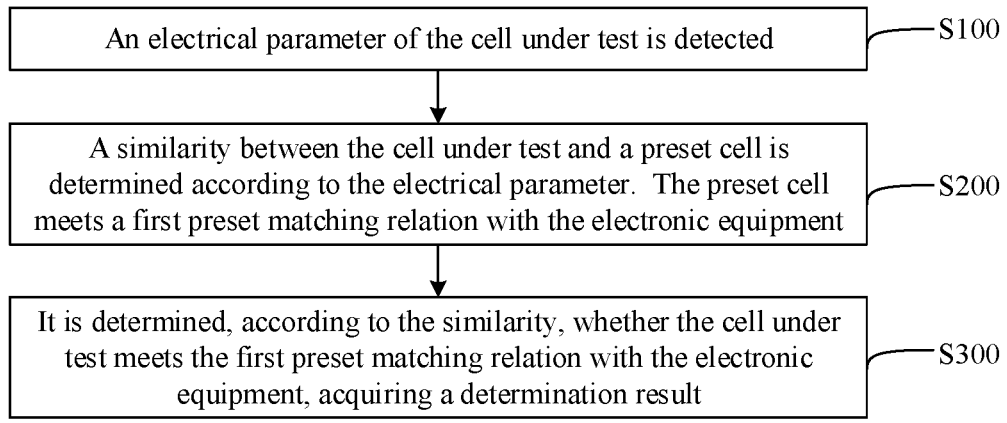
FIG. 1 is a flowchart of a method for identifying a battery, according to an example of the present disclosure.

A detailed description will now be made to embodiments, examples of which are illustrated in the accompanying drawings. The following description refers to the accompanying drawings, in which identical or similar elements in two drawings are denoted by identical reference numerals unless indicated otherwise. Implementations set forth in the following embodiments do not represent all implementations in accordance with the subject disclosure. Rather, they are mere examples of the apparatus (i.e., device/equipment/terminal) and method in accordance with certain aspects of the subject disclosure as recited in the accompanying claims. The example implementation modes may take on multiple forms, and should not be taken as being limited to examples illustrated herein. Instead, by providing such implementation modes, embodiments herein may become more comprehensive and complete, and comprehensive concept of the example implementation modes may be delivered to those skilled in the art. Implementations set forth in the following embodiments do not represent all implementations in accordance with the subject disclosure. Rather, they are merely examples of the apparatus and method in accordance with certain aspects herein as recited in the accompanying claims.

The terms used in the present disclosure are for the purpose of describing particular examples only and are not intended to limit the present disclosure. Terms determined by "a," "the" and "said" in their singular forms in the present disclosure and the appended claims are also intended to include a plurality, unless clearly indicated otherwise in the context. It should also be understood that the term "and/or" as used herein refers to and includes any and all possible combinations of one or more of the associated listed items.

Note that although a term such as first, second, third may be adopted in an embodiment herein to describe various kinds of information, such information should not be limited to such a term. Such a term is merely for distinguishing information of the same type. For example, without departing from the scope of the embodiments herein, the first information may also be referred to as the second information. Similarly, the second information may also be referred to as the first information. Depending on the context, a "if" as used herein may be interpreted as "when" or "while" or "in response to determining that."

In addition, described characteristics, structures or features may be combined in one or more implementation modes in any proper manner. In the following descriptions, many details are provided to allow a full understanding of embodiments herein. However, those skilled in the art will know that the technical improvements of embodiments herein may be carried out without one or more of the details; alternatively, another method, component, device, option, etc., may be adopted. Under other conditions, no detail of a known structure, method, device, implementation, material or operation may be shown or described to avoid obscuring aspects of embodiments herein.

A block diagram shown in the accompanying drawings may be a functional entity which may not necessarily correspond to a physically or logically independent entity. Such a functional entity may be implemented in form of software, in one or more hardware modules or integrated circuits, or in different networks and/or processor devices and/or microcontroller devices.

A terminal may sometimes be referred to as a smart terminal. The terminal may be a mobile terminal. The terminal may also be referred to as User Equipment (UE), a Mobile Station (MS), etc. A terminal may be equipment or a chip provided therein that provides a user with a voice and/or data connection, such as handheld equipment, onboard equipment, etc., with a wireless connection function. Examples of a terminal may include a mobile phone, a tablet computer, a notebook computer, a palm computer, a Mobile Internet Device (MID), wearable equipment, Virtual Reality (VR) equipment, Augmented Reality (AR) equipment, a wireless terminal in industrial control, a wireless terminal in unmanned drive, a wireless terminal in remote surgery, a wireless terminal in a smart grid, a wireless terminal in transportation safety, a wireless terminal in smart city, a wireless terminal in smart home, etc.

As electronic equipment such as a mobile phone plays an increasingly important role in life, a user relies increasingly on such electronic equipment. For example, to increase a battery life of a mobile phone, in general, the mobile phone may be provided with a battery of high capacity. To increase a charging speed, in general, the battery of the mobile phone may be charged in a Quick Charge (QC) mode.

In general, a battery may be charged in the QC mode with high power, posing a high requirement on performance of the battery per se. In general, an imitation or counterfeit battery may fail to support the QC mode. Therefore, an imitation battery being charged in the QC mode may have a low charging speed, impacting user experience, even causing explosion of the imitation battery, jeopardizing user safety.

In view of this, embodiments herein provide a method for identifying a battery. Referring to FIG. 1, the method is applied to electronic equipment. The battery includes a cell under test. The method includes a step as follows.

In S100, an electrical parameter of the cell under test is detected.

In S200, a similarity between the cell under test and a preset cell is determined according to the electrical parameter. The preset cell meets a first preset matching relation with the electronic equipment.

In S300, it is determined, according to the similarity, whether the cell under test meets the first preset matching relation with the electronic equipment, acquiring a determination result.

In S100, a to-be-detected electrical parameter of the cell under test may include a State Of Charge (SOC) of the cell under test, a current output by the cell under test, a voltage on the cell under test, a voltage changing rate at which the voltage on the cell under test changes when the cell under test is being charged, a charging current changing rate at which a charging current for charging the cell under test changes, etc.

Exemplarily, a cell under test may include multiple states such as a charging state, a discharging state, or a standby state.

When a cell under test is in a charging state, an external power supply may deliver energy to the cell under test to charge the cell under test.

When a cell under test is in a discharging state, the cell under test may deliver energy to electronic equipment electrically connected to the cell under test to power the electronic equipment.

When a cell under test is in a standby state, the cell under test is not charging or discharging. A cell under test in a standby state may be deemed to consume little electric energy. Electric energy consumption due to self-discharge inside a cell under test in a standby state may be considered, mainly.

Note that in S100, an electrical parameter of a cell under test may be detected respectively for different states of the cell under test. The similarity between the cell under test and the preset cell may be determined according to electrical parameters of the cell under test in the different states, improving accuracy of the determination result acquired according to the similarity.

Exemplarily, in S200, the similarity between the cell under test and the preset cell may be determined according to the electrical parameter of the cell under test and a preset electrical parameter of the preset cell. Understandably, both the cell under test and the preset cell are cells.

For example, the similarity between the cell under test and the preset cell may be determined according to a difference between the electrical parameter of the cell under test and the preset electrical parameter of the preset cell. As another example, the similarity between the cell under test and the preset cell may also be determined according to a ratio of the electrical parameter of the cell under test to the preset electrical parameter of the preset cell.

The first preset matching relation may indicate that the preset cell is an original cell of the electronic equipment.

Note that when electronic equipment provided with an original cell is charged, the original cell may be charged according to a charging protocol set by the electronic equipment, and it is unlikely that a safety incident may occur during charging.

A charging protocol set by electronic equipment may include a QC protocol, such as a Power Delivery (PD) QC protocol or a QC protocol.

Moreover, an original cell may discharge to power electronic equipment in a discharging mode as needed by the electronic equipment, and it is unlikely that a safety incident may occur during discharging.

For example, when electronic equipment such as a mobile phone is in the standby state, the mobile phone may consume little power. A cell may meet a requirement of the mobile phone in the standby state only by outputting a low current. However, when a user is to play a game using the mobile phone, the mobile phone may need a high current. When the cell does not meet the first preset matching relation with the electronic equipment, the cell may fail to output the current needed by the mobile phone, thereby causing an increasing temperature of the cell, or rendering the user unable to play the game normally using the mobile phone, impacting user experience.

That is, electronic equipment may be provided with a cell meeting the first preset matching relation with the electronic equipment, not only ensuring charging experience, but also reducing a potential safety threat, facilitating safety of the electronic equipment.

In S300, the determination result may be used to indicate whether the cell under test meets the first preset matching relation with the electronic equipment. Understandably, the electronic equipment may control charging and discharging of the cell under test in the battery according to the determination result, ensuring safety in using the battery and the electronic equipment.

With embodiments herein, an electrical parameter of a cell under test is acquired. A similarity between the cell under test and a preset cell is determined according to the electrical parameter of the cell under test. It is determined, according to the similarity, whether the cell under test meets the first preset matching relation with the electronic equipment, acquiring a determination result. Accordingly, a cell under test in a battery is identified. Charging and discharging of the cell under test is controlled according to a determination result thereof, improving safety in using the electronic equipment provided with the cell under test, slowing down aging of the battery, increasing a service life of the battery, ensuring good user experience.

S200 may include an option as follows.

A chemical parameter feature value of the cell under test may be determined according to the electrical parameter of the cell under test.

A similarity between the chemical parameter feature value of the cell under test and a chemical parameter feature value of the preset cell may be determined.

A chemical parameter feature value of a cell may be used to indicate performance of the cell. A chemical parameter feature value of a cell may include one or more parameters.

A chemical parameter feature value of a cell may include at least one of a theoretical maximum chemical capacity $Q_{max}$, a Full Charge Capacity (FCC) of the cell, a Depth Of Discharge (DOD), a State Of Health (SOH) of the cell, an impedance (specifically, resistance) of the cell, and a per-unit-time voltage drop (K value).

The theoretical maximum chemical capacity may also be referred to as a rated capacitance of the cell. For example, when a new cell is in a fully charged state, it may be deemed that an actual capacitance of the new cell equals the theoretical maximum chemical capacity. A new cell here may refer to a cell that has never discharged.

The FCC of the cell may refer to a capacity of the cell that is actually dischargeable after the cell has been fully charged.

For example, after a cell of a rated capacity of 3,300 milliampere (mA) has been fully charged, theoretically speaking, a capacity of 3,300 mA may be discharged. However, in practice, a capacity actually dischargeable may be less than 3,300 mA due to impact of a factor such as self-discharge of the cell, internal resistance of the cell, etc. Therefore, the FCC of the cell may also reflect performance of the cell.

The DOD may be used to reflect how much the cell has discharged. The DOD of the cell may be deemed as a percentage of a capacity discharged by the cell to the rated capacity.

For example, when the DOD of the cell is 100%, it may be deemed that the cell is in a power depleted state. When the DOD of the cell is 0, it may be deemed that the cell is in the fully charged state.

The SOH of the cell may refer to capability of the cell to store charge. The better the SOH of the cell is, the more capable the cell is of storing charge.

The impedance of the cell may refer to an age of the cell. The impedance of the cell may be computed according to a current and a voltage of the cell as detected. Understandably, different types of cells may have different impedances.

Exemplarily, the impedance of the cell may be detected multiple times to acquire an impedance table (R-table) of the cell. The similarity between the cell and the preset cell may be determined according to the R-table of the cell, improving accuracy of the determined similarity.

The per-unit-time voltage drop may be used to measure self-discharge performance of the cell. Understandably, a cell not discharging toward the electronic equipment may self discharge due to partial short-circuit of a micro structure of the cell, causing a voltage drop over the cell. In general, the lower the per-unit-time voltage drop of the cell is, the better the cell may perform.

Note that the similarity between the chemical parameter feature value of the cell under test and the chemical parameter feature value of the preset cell may be deemed as the similarity between the cell under test and the preset cell.

For example, a chemical parameter feature value may include six feature values, i.e., a theoretical maximum chemical capacity, an FCC of the cell, a DOD, a SOH, an impedance, and a per-unit-time voltage drop. A parameter similarity between each feature value of the cell under test and the each feature value of the preset cell may be computed. Then, a coefficient may be allocated to the parameter similarity corresponding to each feature value according to an impact factor of the each feature value to the similarity. Finally, the similarity between the chemical parameter feature value of the cell under test and the chemical parameter feature value of the preset cell may be determined according to each parameter similarity and the coefficient allocated thereto.

The parameter similarity α between the theoretical maximum chemical capacities may be expressed as follows.

$$\alpha = \frac{Q_{max1}}{Q_{max2}} \quad (1)$$

The $Q_{max1}$ may refer to the theoretical maximum chemical capacity of the cell under test. The $Q_{max2}$ may refer to the theoretical maximum chemical capacity of the preset cell.

The parameter similarity $\beta$ between the FCCs may be expressed as follows.

$$\beta = \frac{FCC_1}{FCC_2} \quad (2)$$

The $FCC_1$ may refer to the FCC of the cell under test. The $FCC_2$ may refer to the FCC of the preset cell.

The parameter similarity $\gamma$ between the impedances of the cells may be expressed as follows.

$$\gamma = \frac{R_1}{R_2} \quad (3)$$

The $R_1$ may refer to the impedance of the cell under test. The $R_2$ may refer to the impedance of the preset cell.

The parameter similarity $\delta$ between the DODs may be expressed as follows.

$$\delta = \frac{DOD_1}{DOD_2} \quad (4)$$

The $DOD_1$ may refer to the DOD of the cell under test. The $DOD_2$ may refer to the DOD of the preset cell.

The parameter similarity $\varepsilon$ between the SOHs of the cells may be expressed as follows.

$$\varepsilon = \frac{SOH_1}{SOH_2} \quad (5)$$

The $SOH_1$ may refer to the SOH of the cell under test. The $SOH_2$ may refer to the SOH of the preset cell.

The parameter similarity k between the voltage drops per unit time may be expressed as follows.

$$k = \frac{K_1}{K_2} \quad (6)$$

The $K_1$ may refer to the per-unit-time voltage drop of the cell under test. The $K_2$ may refer to the per-unit-time voltage drop of the preset cell.

Note that the chemical parameter feature value of the preset cell may be determined by experiment. The chemical parameter feature value of the preset cell may be burned in advance in an Application Processor (AP) of the electronic equipment.

Therefore, the similarity between the chemical parameter feature value of the cell under test and the chemical parameter feature value of the preset cell may be expressed as follows.

$$Y = A\%\alpha + B\%\beta + C\%\gamma + D\%\delta + E\%\varepsilon + F\%k \quad (7)$$

The A % may refer to the coefficient allocated to the parameter similarity between the theoretical maximum chemical capacities. The B % may refer to the coefficient allocated to the parameter similarity between the FCCs. The C % may refer to the coefficient allocated to the parameter similarity between the impedances. The D % may refer to the coefficient allocated to the parameter similarity between the DODs. The E % may refer to the coefficient allocated to the parameter similarity between the SOHs of the cells. The F % may refer to the coefficient allocated to the parameter similarity between the per-unit-time voltage drops. The A %, B %, C %, D %, E %, and F % may all be numerical values greater than 0 and less than 1.

Exemplarily, different coefficients may be allocated to the parameter similarities corresponding to different feature values. For example, the six coefficients A %, B %, C %, D %, E %, and F % may differ.

In general, to charge quickly, electronic equipment may support the QC protocol, charging the cell using high power. Charging a cell not supporting the QC protocol using high power may tend to damage the cell, and even damage the electronic equipment, endangering user safety. Therefore, in identifying a battery, in general, maximum charging power supported by a cell under test may have to be identified.

Note that as an impedance and a theoretical maximum chemical capacity may reflect maximum charging power supported by a cell under test, of the six coefficients, the A % and the C % may be large. Both the A % and the C % may be greater than the B %, the D %, the E %, and the F %. The B %, the D %, and the E % may be equal. The F % may be the least.

The C % may be 40%. The A % may be 25%. The B %, the D %, and the E % may all be 10%. The F % may be 5%.

Understandably, when multiple chemical parameter feature values of the cell under test are determined, units of different feature values may differ. Therefore, by computing the parameter similarity corresponding to each feature value, inaccurate similarity caused by inconsistent units of the feature values may be avoided, ensuring accuracy of the similarity.

Different feature values may have different impact on the similarity between the cell under test and the preset cell. Therefore, with embodiments herein, the coefficient for the parameter similarity corresponding to each feature value in the formula (7) for computing the similarity may be allocated according to the impact factor of the each feature value to the similarity, further improving accuracy of the determined similarity.

Exemplarily, S300 may include an option as follows. When the similarity is no less than a preset threshold, a first determination result indicating that the cell under test meets the first preset matching relation with the electronic equipment may be acquired.

When the similarity is less than the preset threshold, a second determination result indicating that the cell under test does not meet the first preset matching relation with the electronic equipment may be acquired.

Exemplarily, the preset threshold may be determined by experiment. For example, the preset threshold may be determined by performing a charging and discharging test on multiple cells not meeting the first preset matching relation with the electronic equipment.

The method may further include an option as follows.

A cycle number of the battery may be acquired.

A value of the preset threshold may be adjusted according to the cycle number.

Exemplarily, the cycle number of the battery may be a number of cycles the cell under test charges and discharges.

The cell may age as the cycle number of the cell increases. Therefore, the cycle number of the cell may roughly reflect the age of the cell. Understandably, the chemical parameter feature value of the cell may relate closely to the age of the cell.

For example, in practical use, the internal resistance of the cell may gradually increase as the cycle number that the cell charges and discharges increases. Accordingly, the actual capacitance of the cell may be less than the theoretical maximum chemical capacity of the cell when the cell is in the fully charged state.

As another example, the age of the cell may also impact the FCC of the cell. The internal resistance of the cell may increase as the cycle number increases. The FCC of the cell may decrease gradually, as well.

Moreover, the impedance of the cell may also change as the cycle number of the cell changes. For example, the internal resistance of the cell may increase gradually as the cycle number of the cell increases. That is, the impedance of the cell may increase.

Exemplarily, when the cycle number increases, the value of the preset threshold may increase. For example, when the cycle number of the battery is in a first range, the preset threshold may have a first value. When the cycle number of the battery increases from the first range and enters a second range, the preset threshold may have a second value. The second value may be greater than the first value.

Therefore, compared to acquiring determination results for cells under test with different cycle numbers using one fixed preset threshold, with embodiments herein, the cycle number of the battery is acquired. The value of the preset threshold is adjusted according to the cycle number of the battery. Accordingly, the value of the preset threshold may be adjusted according to different cycle numbers of the battery, improving accuracy of the determination result acquired by comparing the similarity to the preset threshold, providing improved accuracy for subsequent control of charging and discharging of the cell under test, thereby improving safety in using electronic equipment provided with the cell under test as well as user experience.

In addition to a cell, a battery of electronic equipment may further include a battery protecting component electrically connected to the cell. A battery protecting component may be used to protect a cell. A battery protecting component may include a Pulse Code Modulation (PCM) component, etc. The battery protecting component, for example, may be a battery protecting circuit.

When a cell and electronic equipment meet the first preset matching relation, i.e., the cell is an original cell, if a battery protecting component and the electronic equipment meet a second preset matching relation, i.e., the battery protecting component is an original battery protecting component, the original battery protecting component may protect the original cell effectively. For example, the original battery protecting component may protect the cell from overcharging, over discharging, an overly high temperature, etc.

However, when a battery protecting component is not an original battery protecting component but an imitation battery protecting component, the imitation battery protecting component and the electronic equipment do not meet the second preset matching relation, and the imitation battery protecting component may not protect the original cell, and may still pose a potential safety threat.

In view of this, in some embodiments, the battery may further include a battery protecting component under test. The method may further include an option as follows.

A first sequence may be read from the battery protecting component under test.

in response to a failure to read the first sequence, it may be determined that the battery protecting component under test does not meet a second preset matching relation with the electronic equipment.

When the battery protecting component meets the second preset matching relation with the electronic equipment, it may be deemed that the battery protecting component is an original battery protecting component of the electronic equipment.

When the battery protecting component under test does not meet the second preset matching relation with the electronic equipment, the electronic equipment may not read the first sequence from the battery.

With embodiments herein, when the first sequence fails to be read, it may be determined straightforwardly that the battery protecting component under test does not meet a second preset matching relation with the electronic equipment, which is simple, and the identification is efficient.

Figure 2:
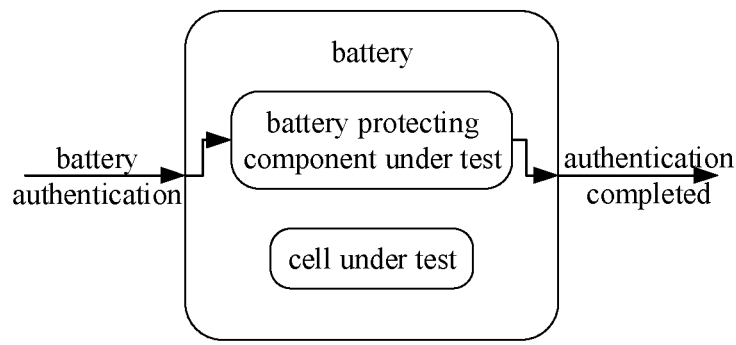
FIG. 2 is a diagram of logic of a method for identifying a battery, according to an example of the present disclosure.

FIG. 2 is a diagram of an improvement for identifying a battery according to an example of the present disclosure. The improvement may be applied to electronic equipment. The battery may include a cell under test and a battery protecting component under test. The battery protecting component under test may include a coulomb counter with an encryption algorithm or an encrypting Integrated Circuit (IC).

Referring to FIG. 2, controlled by a control signal for authenticating the battery, the coulomb counter with the encryption algorithm or the encrypting IC in the battery protecting component under test may generate a first random code. A system of the electronic equipment may decrypt and identify the first random code through a Secure Hash Algorithm (SHA), to determine whether the battery protecting component under test is an original battery protecting component. Authentication may complete after the battery protecting component under test has been identified. With the improvement, only the battery protecting component under test is identified, and it is determined whether the battery is an original battery according to a result of identifying the battery protecting component under test, without identifying the cell under test.

In practice, an original battery protecting component may be reused. For example, an original battery protecting component in an original battery may be assembled with an imitation cell, forming an imitation battery. As the imitation battery includes the original battery protecting component, the electronic equipment may read the first sequence. The imitation battery may be mistaken as an original battery if the battery is identified using the improvement shown in FIG. 2. Yet the imitation battery is still not an original battery of the electronic equipment. Use of the imitation battery may still pose a potential safety threat.

In view of this, in some embodiments, the method may further include an option as follows.

If the first sequence is read, a second sequence may be generated. When the battery protecting component under test meets the second preset matching relation with the electronic equipment, the battery protecting component under test may generate the first sequence in a mode same as how a processing component of the electronic equipment generates the second sequence. The processing component, for example, may be a processing circuit or processor.

It may be determined, according to the first sequence and the second sequence, whether the battery protecting component under test meets the second preset matching relation with the electronic equipment, acquiring a matching result.

Both the first sequence and the second sequence may be random number sequences. The first sequence may be a sequence generated by the battery protecting component under test. The second sequence may be a sequence generated by the processing component of the electronic equipment.

Exemplarily, the second sequence may be generated as follows. The second sequence may be generated based on a cycle number of the preset cell and an identification of a preset battery protecting component.

The electronic equipment may generate the second sequence by encrypting the cycle number of the preset cell and the identification of the preset battery protecting component through an SHA.

The cycle number of the preset cell and the identification of the preset battery protecting component may be stored in the electronic equipment. To identify a battery currently provided to the electronic equipment, the processing component of the electronic equipment may read the cycle number of the preset cell and the identification of the preset battery protecting component.

For example, when the electronic equipment detects that it is disconnected from the battery and is to reestablish a connection with the battery, a battery currently provided to the electronic equipment may have to be identified. Understandably, when a user removes a battery from the electronic equipment, the electronic equipment may detect that it is disconnected from the battery. When the user remounts the battery in the electronic equipment, the electronic equipment may reestablish a connection with the battery.

Alternatively, when the electronic equipment is switched from an off state to an on state, a battery currently provided may have to be identified. When the electronic equipment is in the off state, the battery may stop powering the electronic equipment. When the electronic equipment is in the on state, the battery may start to power the electronic equipment. Note that when the electronic equipment is in the off state, the battery of the electronic equipment may be replaced.

When the battery protecting component under test meets the second preset matching relation with the electronic equipment, the battery protecting component under test may generate the first sequence based on the cycle number of the cell under test and an identification of the battery protecting component under test. Accordingly, it may be determined whether the battery protecting component under test and the cell under test form an original assembly while determining whether the battery protecting component under test meets the second preset matching relation with the electronic equipment.

Note that when the cell under test is a first original cell acquired from a first original battery, the battery protecting component under test is a second original battery protecting component acquired from a second original battery, and a cycle number of the first original battery differs from a cycle number of the second original battery, if the first original cell and the second original battery protecting component are assembled into a battery, as the first original cell and the second original battery protecting component do not form an original assembly, the second original battery protecting component may not protect the first original cell very well, lowering charging experience.

Therefore, with embodiments herein, a first sequence is generated according to a cycle number of a cell under test and an identification of a battery protecting component under test. A second sequence is generated when the first sequence is read. It may be determined whether the battery protecting component under test meets a second preset matching relation with electronic equipment according to the second sequence, acquiring a matching result, improving accuracy in battery identification, thereby improving user experience and safety in using the battery.

Exemplarily, it may be determined, according to the first sequence and the second sequence, whether the battery protecting component under test meets the second preset matching relation with the electronic equipment, acquiring the matching result, as follows.

When the first sequence and the second sequence are identical, a first matching result indicating that the battery protecting component under test meets the second preset matching relation with the electronic equipment may be acquired.

When the first sequence and the second sequence differ, a second matching result indicating that the battery protecting component under test does not meet the second preset matching relation with the electronic equipment may be acquired.

Both the first matching result and the second matching result may be numerical values or control signals. The electronic equipment may control charging and discharging of the battery according to the first matching result or the second matching result.

With embodiments herein, it may be determined whether the battery protecting component under test meets the second preset matching relation with the electronic equipment by comparing the first sequence and the second sequence, which is simple.

In general, a numerical value reflecting the cycle number of the battery may be turned in the battery protecting component. The numerical value may be burned in an imitation battery protecting component repeatedly. That is, the numerical value burned in the imitation battery protecting component may be changed as needed. Accordingly, the imitation battery protecting component may be reused repeatedly. Thus, the numerical value in the imitation battery protecting component may not reflect the actual cycle number of the cell, decreasing safety in using the battery.

For example, a cell may have a service life of 800 cycles. When the cycle number of the cell reaches 750, the cell may be charged and discharged for 50 cycles, and the numerical value in an original battery protecting component may be 50. When the numerical value in the original battery protecting component decreases to 0, the cell may not be used any longer, and may have to be replaced by a new battery.

However, to reuse the battery, the original battery protecting component may be replaced with an imitation battery protecting component, and the numerical value in the imitation battery protecting component may be re-burned as 800. Consequently, the electronic equipment using the battery may mistake that the cell of the battery may be charged and discharged for 800 cycles, while actually the cell of the battery may be charged and discharged for but 50 cycles.

Exemplarily, available capacity of a cell may vary depending on a cycle number. Therefore, the FCC of a cell with a cycle number of 50 may differ from the FCC of a cell with a cycle number of 800. Therefore, use of an imitation battery protecting component may lower charging experience of a user.

In view of this, in some embodiments, the battery may further include a battery protecting component under test. The battery protecting component under test may include a one-time burning counting unit. The method may further include an option as follows. The one-time burning counting unit, for example, may be a one-time burning counter.

A count in the one-time burning counting unit may be acquired. The count may indicate the cycle number of the battery.

Exemplarily, a one-time burning counting unit may refer to a counting unit capable of burning one initial numerical value. After the initial numerical value has been burned, each time the battery is charged and discharged for one cycle, the count in the one-time burning counting unit may change and may differ from the initial numerical value. Other than that, the count in the one-time burning counting unit may not be restored to the initial numerical value by being manually modified, re-burnt, etc. Note that the cycle number of the battery may be the cycle number of the cell under test.

The one-time burning counting unit may include a down counter. When the one-time burning counting unit includes a down counter, the initial numerical value burned in the down counter may indicate the service life of the battery. A count of the down counter may indicate a difference between the service life of the battery and the cycle number of the battery. Here, the service life of the battery is the number of times the battery may charge and discharge cyclically.

For example, for a battery of a service life of 800, the initial numerical value burned in the down counter may be 800. When the battery is charged and discharged for one cycle, the count of the down counter may decrease by 1. When the count of the down counter is 700, the cycle number of the battery may be 100.

With embodiments herein, a count in a one-time burning counting unit is acquired. The count is used to indicate a cycle number of a battery. Accordingly, reuse of a battery protecting component is reduced, ensuring that the acquired count indicates the accurate cycle number of the battery, thereby improving accuracy in battery identification.

Figure 3:
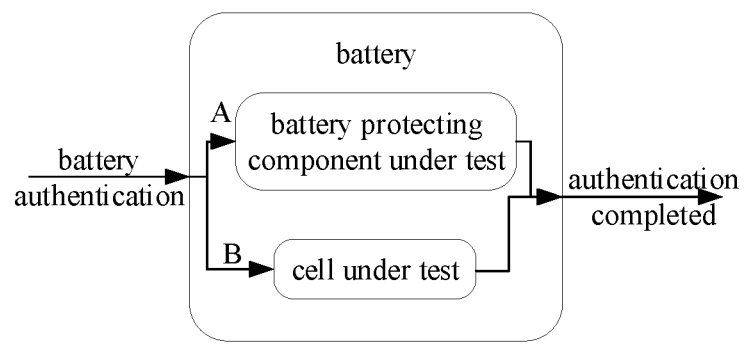
FIG. 3 is a diagram of logic of a method for identifying a battery, according to an example of the present disclosure.

FIG. 3 is a diagram of control logic of a method for identifying a battery according to an example of the present disclosure. Referring to FIG. 3, to identify a battery, on one hand, a control signal for authenticating the battery may be delivered to a battery protecting component under test through a branch A to identify the battery protecting component under test, acquiring a matching result. On the other hand, the control signal for authenticating the battery may be delivered to a cell under test through a branch B to identify the cell under test, acquiring a determination result. Authentication may complete after the matching result and the determination result have been acquired.

With embodiments herein, it may be determined whether a cell under test meets a first preset matching relation with electronic equipment, acquiring a determination result. It may be determined whether a battery protecting component under test meets a second preset matching relation with the electronic equipment, acquiring a matching result. Then, a specific mode in which PD for the battery is performed may be controlled according to the determination result and/or the matching result, rendering more flexible control over PD, improving user experience while ensuring safety in PD.

The method may further include an option as follows.

Power Delivery (PD) for the battery may be performed in a mode meeting a PD safety condition of the battery according to the determination result and/or the matching result.

Note that when PD for the battery is performed in a mode meeting the PD safety condition of the battery, it is unlikely that a safety incident may occur to the battery, ensuring safety in PD.

PD for a battery may be performed as follows. An external power supply may provide electric energy to the battery, i.e., to charge the battery. Alternatively, the battery may provide electric energy to electronic equipment, i.e., by discharging.

Exemplarily, PD may be performed in different modes depending on the determination result, as well as on the matching result.

Power Delivery (PD) for the battery may be performed in the mode meeting the PD safety condition of the battery according to the determination result and/or the matching result as follows.

When the determination result indicates that the cell under test meets the first preset matching relation with the electronic equipment, and the matching result indicates that the battery protecting component under test meets the second preset matching relation with the electronic equipment, PD for the battery may be performed in a first mode.

When the determination result indicates that the cell under test does not meet the first preset matching relation with the electronic equipment, PD for the battery may be performed in a second mode.

When the matching result indicates that the battery protecting component under test does not meet the second preset matching relation with the electronic equipment, PD for the battery may be performed in the second mode.

A delivery current in the second mode may be less than a delivery current in the first mode.

Exemplarily, PD for the battery may refer to charging the battery. The first mode may include a QC mode, such as a PD QC mode or a QC mode. The delivery current in the first mode may be no less than 2 amperes.

The second mode may include a slow charge mode, such as a charge mode of charging with a current of 0.7 ampere, or a charge mode of charging with a current of 1 ampere.

With embodiments herein, PD for the battery is performed in a mode meeting a PD safety condition of the battery according to the determination result and/or the matching result, ensuring safety in PD for the battery, ensuring safety of user property.

When the determination result indicates that the cell under test does not meet the first preset matching relation with the electronic equipment, PD for the battery may be performed in the second mode as follows.

When the determination result indicates that the cell under test does not meet the first preset matching relation with the electronic equipment, a delivery current in the second mode may be determined according to the similarity between the cell under test and the preset cell.

Exemplarily, when the determination result indicates that the cell under test does not meet the first preset matching relation with the electronic equipment, a safety class of the cell under test may be determined according to the similarity between the cell under test and the preset cell. The delivery current in the second mode may be determined according to the safety class of the cell under test.

For example, when the similarity between the cell under test and the preset cell is greater than a first threshold and less than the preset threshold, the cell under test may be of a first safety class. PD for the battery may be performed using a first delivery current in the second mode. The first delivery current may be less than the delivery current in the first mode.

When the similarity between the cell under test and the preset cell is no greater than a second threshold, the cell under test may be of a second safety class. PD for the battery may be performed using a second delivery current in the second mode. The second delivery current may be less than the first delivery current.

Note that the second delivery current may be 0. When the second delivery current is 0, it may be deemed that PD for the battery is stopped. That is, charging of the battery, as well as discharging of the battery toward the electronic equipment, may be stopped.

Understandably, multiple cells under test not meeting the first preset matching relation with the electronic equipment may differ in performance. Therefore, it may be roughly estimated, according to the similarity between the cell under test and the preset cell, how close the cell under test is to the preset cell in terms of performance, thereby distinguishing cells under test of different safety classes, and determining the delivery current in the second mode.

Compared to performing PD using a fixed delivery current in the second mode, with embodiments herein, a delivery current in the second mode may be determined according to a similarity between a cell under test and a preset cell, rendering more flexible control over PD in the second mode, meeting demands for applying batteries of different similarities.

The method may further include at least one option as follows.

When the determination result indicates that the cell under test does not meet the first preset matching relation with the electronic equipment, a first state indication indicating an abnormality in the cell under test may be output.

When the matching result indicates that the battery protecting component under test does not meet the second preset matching relation with the electronic equipment, a second state indication indicating an abnormality in the battery protecting component under test may be output.

Exemplarily, the first state indication output may include a voice indication, a text indication, etc. For example, when the first state indication output includes a voice indication, sound information "battery cell provided is not adapted to the device" may be output. When the first state indication output includes a text indication, text information "battery cell provided is not adapted to the device" may be displayed on a display interface of the electronic equipment.

Similarly, the second state indication output may include a voice indication, a text indication, etc. For example, when the second state indication output includes a voice indication, sound information "battery protecting component provided is not adapted to the device" may be output. When the second state indication output includes a text indication, text information "battery protecting component provided is not adapted to the device" may be displayed on a display interface of the electronic equipment.

Note that when a determination result indicates that a cell under test does not meet a first preset matching relation with electronic equipment, if the electronic equipment provided with the cell under test is still charged, the cell under test may be charged not using a charging protocol set by the electronic equipment, but using low power, ensuring charging safety.

When a matching result indicates that a battery protecting component under test does not meet a second preset matching relation with electronic equipment, if the electronic equipment provided with the battery protecting component under test is still charged, the cell under test may be charged not using a charging protocol set by the electronic equipment, but using low power, ensuring charging safety.

For example, when the cell under test does not meet the first preset matching relation with the electronic equipment and/or the battery protecting component under test does not meet the second preset matching relation with the electronic equipment, the cell under test may be charged using 20 watts or lower power.

With embodiments herein, when the determination result indicates that the cell under test does not meet the first preset matching relation with the electronic equipment, a first state indication indicating an abnormality in the cell under test may be output. In addition/Alternatively, when the matching result indicates that the battery protecting component under test does not meet the second preset matching relation with the electronic equipment, a second state indication indicating an abnormality in the battery protecting component under test may be output. Accordingly, a user may be notified in time when identifying an abnormality in the cell under test and/or an abnormality in the battery protecting component under test. Then, the user may learn about a cause of the abnormality in the battery in time, improving user experience.

Figure 4:
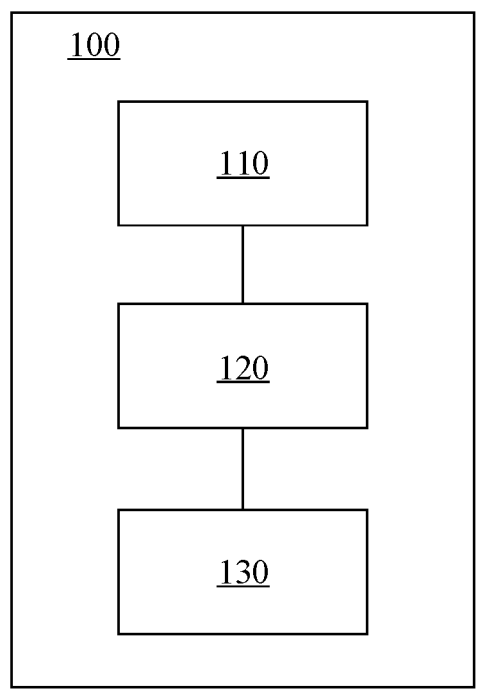
FIG. 4 is a block diagram of a device for identifying a battery, according to an example of the present disclosure.

FIG. 4 is a block diagram of a device 100 for identifying a battery according to an example of the present disclosure. Referring to FIG. 4, the device 100 for identifying a battery includes a detecting module 110, a determining module 120, and a matching module 130.

The detecting module 110 is adapted to detecting an electrical parameter of a cell under test of the battery.

The determining module 120 is electrically connected to the detecting module 110. The determining module 120 is adapted to determining a similarity between the cell under test and a preset cell according to the electrical parameter of the cell under test. The preset cell meets a first preset matching relation with electronic equipment using the battery.

The matching module 130 is electrically connected to the determining module 120. The matching module 130 is adapted to determining, according to the similarity, whether the cell under test meets the first preset matching relation with the electronic equipment, acquiring a determination result.

With embodiments herein, an electrical parameter of a cell under test may be determined using a detecting module. A similarity between the cell under test and a preset cell may be determined according to the electrical parameter of the cell under test. It is determined, according to the similarity, whether the cell under test meets the first preset matching relation with the electronic equipment, acquiring a determination result. Accordingly, a cell under test in a battery is identified. Charging and discharging of the cell under test is controlled according to a determination result thereof, improving safety in using the electronic equipment provided with the cell under test, slowing down aging of the battery, increasing a service life of the battery, ensuring good user experience.

Exemplarily, the determining module 120 may be adapted to: determining a chemical parameter feature value of the cell under test according to the electrical parameter of the cell under test; and determining a similarity between the chemical parameter feature value of the cell under test and a chemical parameter feature value of the preset cell.

Exemplarily, the matching module 130 may be adapted to, in response to the similarity being no less than a preset threshold, acquiring a first determination result indicating that the cell under test meets the first preset matching relation with the electronic equipment.

The matching module 130 may be further adapted to, in response to the similarity being less than the preset threshold, acquiring a second determination result indicating that the cell under test does not meet the first preset matching relation with the electronic equipment.

The matching module 130 may be further adapted to: acquiring a cycle number of the battery; and adjusting a value of the preset threshold according to the cycle number.

With embodiments herein, the matching module acquires a cycle number of the battery and adjusts a value of the preset threshold according to the cycle number, improving accuracy in battery identification.

The device 100 for identifying a battery may further include a first acquiring module.

The first acquiring module may be adapted to acquiring a count in a one-time burning counting unit in a battery protecting component under test of the battery. The count may indicate the cycle number of the battery.

With embodiments herein, a first acquiring module is provided to acquire a count in a one-time burning counting unit. The count is used to indicate the cycle number of the battery. Accordingly, reuse of a battery protecting component is reduced, ensuring that the acquired count indicates the accurate cycle number of the battery, thereby improving accuracy in battery identification.

The device 100 for identifying a battery may further include a second acquiring module and a second matching module.

The second acquiring module may be adapted to reading a first sequence from a battery protecting component under test of the battery, The second matching module may be electrically connected to the second acquiring module. The second matching module may be adapted to, in response to the second acquiring module failing to read the first sequence, determining that the battery protecting component under test does not meet a second preset matching relation with the electronic equipment.

With embodiments herein, a second acquiring module is provided to read a first sequence. A second matching module is provided to, in response to the second acquiring module failing to read the first sequence, determine straightforwardly that the battery protecting component under test does not meet a second preset matching relation with the electronic equipment, which is simple, and the identification is efficient.

The second acquiring module may further be adapted to, in response to the first sequence being read, acquiring a second sequence. When the battery protecting component under test meets the second preset matching relation with the electronic equipment, the battery protecting component under test may generate the first sequence in a mode same as how a processing component of the electronic equipment generates the second sequence.

The second matching module may be further adapted to determining, according to the first sequence and the second sequence, whether the battery protecting component under test meets the second preset matching relation with the electronic equipment, acquiring a matching result.

Exemplarily, the processing component of the electronic equipment may generate the second sequence based on a cycle number of the preset cell and an identification of a preset battery protecting component.

With embodiments herein, when the first sequence is read, the second acquiring module may acquire a second sequence. The second matching module may determine, according to the second sequence, whether the battery protecting component under test meets the second preset matching relation with the electronic equipment, acquiring a matching result, improving accuracy in battery identification, thereby improving user experience and safety in using the battery.

The second matching module may be adapted to, in response to the first sequence and the second sequence being identical, acquiring a first matching result indicating that the battery protecting component under test meets the second preset matching relation with the electronic equipment.

The second matching module may be further adapted to, in response to the first sequence and the second sequence differing, acquiring a second matching result indicating that the battery protecting component under test does not meet the second preset matching relation with the electronic equipment.

With embodiments herein, the second matching module compares the first sequence and the second sequence to determine whether the battery protecting component under test meets the second preset matching relation with the electronic equipment, which is simple.

Figure 5:
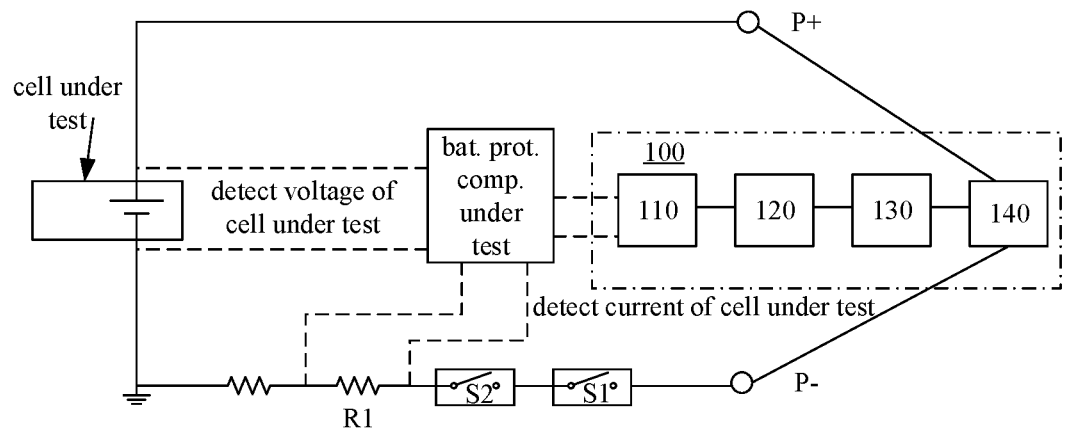
FIG. 5 is a diagram of a circuit of identifying a battery by a device for identifying a battery, according to an example of the present disclosure.

Referring to FIG. 5, the device 100 for identifying a battery may further include a control module.

The control module 140 may be electrically connected to the matching module 130 and the second matching module. The control module may be adapted to performing, according to the determination result and/or the matching result, Power Delivery (PD) for the battery in a mode meeting a PD safety condition of the battery.

Referring to FIG. 5, the detecting module 110 may be electrically connected to the battery protecting component under test of the battery. The detecting module may detect, via the battery protecting component under test, a voltage on the cell under test and a current through the cell under test. The control module 140 may be electrically connected to the cell under test through a node P+ and a node P−.

Understandably, the current through the cell under test may be determined by detecting a voltage on a resistor R1. The resistance of the resistor R1 may be known.

Exemplarily, the control module 140 may be adapted to at least one of:

in response to the determination result indicating that the cell under test meets the first preset matching relation with the electronic equipment, and the matching result indicating that the battery protecting component under test meets the second preset matching relation with the electronic equipment, performing PD for the battery in a first mode;

in response to the determination result indicating that the cell under test does not meet the first preset matching relation with the electronic equipment, performing PD for the battery in a second mode; or in response to the matching result indicating that the battery protecting component under test does not meet the second preset matching relation with the electronic equipment, performing PD for the battery in the second mode.

A delivery current in the second mode may be less than a delivery current in the first mode.

With embodiments herein, a control module 140 is provided. The control module 140 may perform PD for the battery in the mode meeting the PD safety condition of the battery according to the determination result and/or the matching result, reducing a risk of a safety incident in PD, improving safety in PD.

The device 100 for identifying a battery may further include an output module.

The output module may be electrically connected to the matching module 130 and the second matching module. The output module may be adapted to at least one of:

in response to the determination result indicating that the cell under test does not meet the first preset matching relation with the electronic equipment, outputting a first state indication indicating an abnormality in the cell under test; or in response to the matching result indicating that the battery protecting component under test does not meet the second preset matching relation with the electronic equipment, outputting a second state indication indicating an abnormality in the battery protecting component under test.

With embodiments herein, an output module may be provided to, in response to the determination result indicating that the cell under test does not meet the first preset matching relation with the electronic equipment, output a first state indication indicating an abnormality in the cell under test; and/or in response to the matching result indicating that the battery protecting component under test does not meet the second preset matching relation with the electronic equipment, output a second state indication indicating an abnormality in the battery protecting component under test. Accordingly, a user may be notified in time when identifying an abnormality in the cell under test and/or an abnormality in the battery protecting component under test. Then, the user may learn about a cause of the abnormality in the battery in time, improving user experience.

A module of the device according to at least one embodiment herein may perform an operation in a mode elaborated in at least one embodiment of the method herein, which will not be repeated here.

Figure 6:
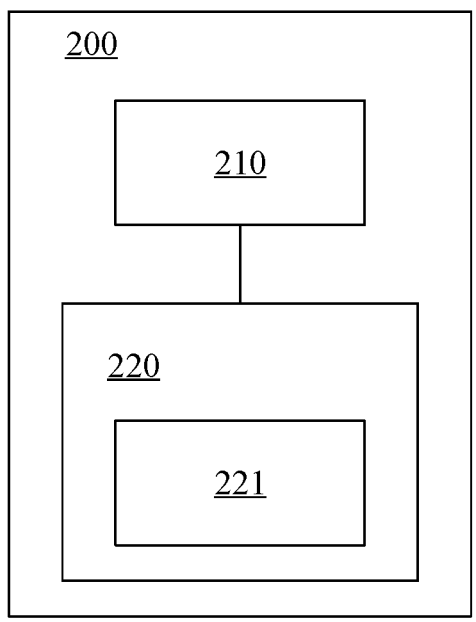
FIG. 6 is a block diagram of a battery, according to an example of the present disclosure.

FIG. 6 is a block diagram of a battery 200 according to an example of the present disclosure. Referring to FIG. 6, the battery 200 includes a cell 210 and a battery protecting component 220.

The cell 210 is adapted to storing electric energy.

The battery protecting component 220 is adapted to protecting the cell 210.

The battery protecting component 220 includes a one-time burning counting unit 221 adapted to forming a count indicating a cycle number of the battery 200.

A one-time burning counting unit 221 may refer to a counting unit capable of burning one initial numerical value. After the initial numerical value has been burned, each time the battery 200 is charged and discharged for one cycle, the count in the one-time burning counting unit may change and may differ from the initial numerical value. Other than that, the count in the one-time burning counting unit 221 may not be restored to the initial numerical value by being manually modified, re-burnt, etc.

The one-time burning counting unit 221 may include a down counter. When the one-time burning counting unit includes a down counter, the initial numerical value burned in the down counter may indicate the service life of the battery 200. A count of the down counter may indicate a difference between the service life of the battery 200 and the cycle number of the battery 200. Here, the service life of the battery 200 is the number of times the battery 200 may charge and discharge cyclically.

For example, for a battery of a service life of 800, the initial numerical value burned in the down counter may be 800. When the battery is charged and discharged for one cycle, the count of the down counter may decrease by 1. When the count of the down counter is 700, the cycle number of the battery may be 100. When the count of the down counter decreases to 0, it may mean that the service life of the battery ends.

Note that a cycle number of a battery 200 may be a cycle number of a cell 210.

With embodiments herein, a one-time burning counting unit 221 may be provided in a battery protecting component 220. A cycle number of a battery 200 may be indicated by a count therein. Accordingly, reuse of the battery protecting component 220 is reduced, ensuring that a count in the one-time burning counting unit 221 indicates the accurate cycle number of the battery 200, reducing a probability of secondary use of the battery protecting component 220, improving safety and reliability of the battery 200.

The battery protecting component 220 may further include an encrypting unit.

The encrypting unit may be electrically connected to the one-time burning counting unit 221. The encrypting unit may be adapted to acquiring the cycle number of the battery 200 and an identification (such as an identification code) of the battery protecting component 220, and encrypting the cycle number of the battery 200 and the identification (such as the identification code) of the battery protecting component 220 using a preset algorithm, generating a first sequence. The encrypting unit, for example, may include an encrypting circuit.

The first sequence may be compared to a second sequence generated by electronic equipment using the battery 200 based on a cycle number of a preset cell and an identification of a preset battery protecting component stored in the electronic equipment, to determine whether the battery protecting component 220 meets a second preset matching relation with the electronic equipment. The preset battery protecting component meets the second preset matching relation with the electronic equipment.

An encrypting unit may include a coulomb counter with a preset algorithm, or an IC capable of implementing encryption.

The preset algorithm may include an encryption algorithm, such as an SHA.

With embodiments herein, an encrypting unit is provided in a battery protecting component 220. Electronic equipment identifies a battery 200 using the encrypting unit, improving safety in using the battery.

Figure 7:
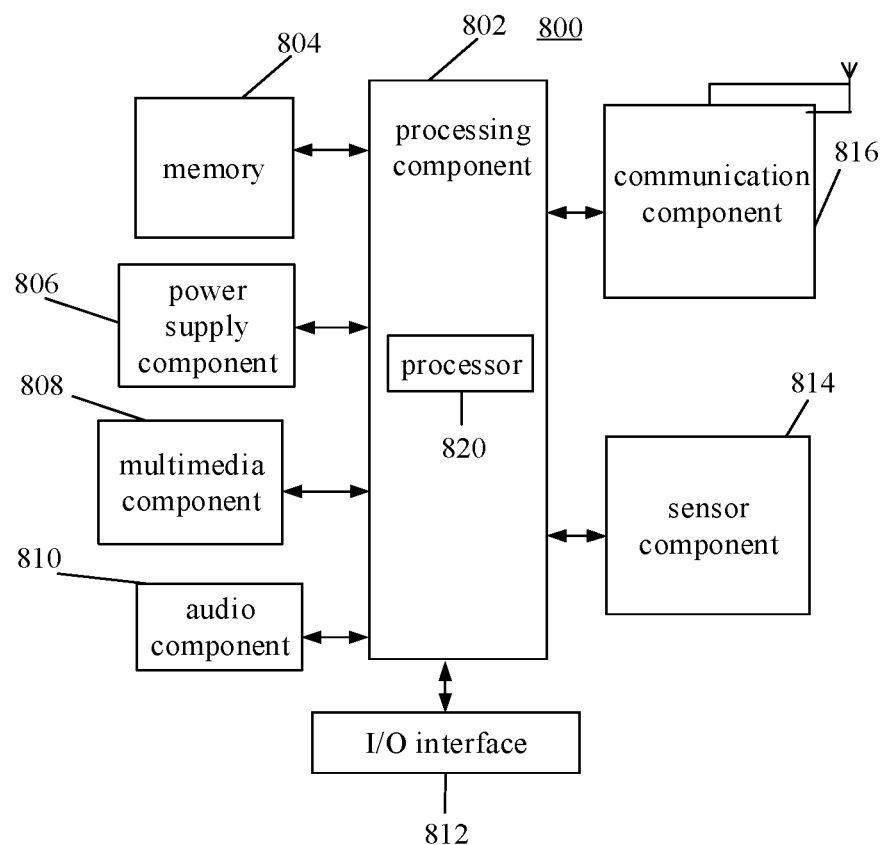
FIG. 7 is a block diagram of a device for identifying a battery, according to an example of the present disclosure.

FIG. 7 is a block diagram of a device 800 for identifying a battery according to an example of the present disclosure. For example, the device 800 may be a mobile phone, a computer, digital broadcasting UE, a message transceiver, a game console, tablet equipment, medical equipment, fitness equipment, a personal digital assistant, etc.

Referring to FIG. 7, the device 800 may include at least one of a processing component 802, memory 804, a power supply component 806, a multimedia component 808, an audio component 810, an Input/Output (I/O) interface 812, a sensor component 814, or a communication component 816.

The processing component 802 may generally control an overall operation of the device 800, such as operations associated with display, a telephone call, data communication, a camera operation, a recording operation, etc. The processing component 802 may include one or more processors 820 to execute instructions so as to complete all or part of the options of an aforementioned method. In addition, the processing component 802 may include one or more modules to facilitate interaction between the processing component 802 and other components. For example, the processing component 802 may include a multimedia module to facilitate interaction between the multimedia component 808 and the processing component 802.

The memory 804 may be adapted to storing various types of data to support the operation at the device 800. Examples of such data may include instructions of any application or method adapted to operating on the device 800, contact data, phonebook data, messages, pictures, videos, etc. The memory 804 may be actualized by any type of transitory or non-transitory storage equipment or a combination thereof, such as Static Random Access Memory (SRAM), Electrically Erasable Programmable Read-Only Memory (EEPROM), Erasable Programmable Read-Only Memory (EPROM), Programmable Read-Only Memory (PROM), Read-Only Memory (ROM), magnetic memory, flash memory, a magnetic disk, a compact disk, etc.

The power supply component 806 may supply electric power to various components of the device 800. The power supply component 806 may include a power management system, one or more power sources, and other components related to generating, managing, and distributing electricity for the device 800.

The multimedia component 808 may include a screen that provides an output interface between the device 800 and a user. The screen may include a Liquid Crystal Display (LCD) and a Touch Panel (TP). If the screen may include a TP, the screen may be actualized as a touch screen to receive a signal input by a user. The TP may include one or more touch sensors for sensing touch, slide, and gestures on the TP. The one or more touch sensors not only may sense the boundary of a touch or slide move, but also detect the duration and pressure related to the touch or slide move. The multimedia component 808 may include at least one of a front camera or a rear camera. When the device 800 is in an operation mode such as a photographing mode or a video mode, at least one of the front camera or the rear camera may receive external multimedia data. Each of the front camera or the rear camera may be a fixed optical lens system or may have a focal length and be capable of optical zooming.

The audio component 810 may be adapted to outputting and/or inputting an audio signal. For example, the audio component 810 may include a microphone (MIC). When the device 800 is in an operation mode such as a call mode, a recording mode, a voice identification mode, etc., the MIC may be adapted to receiving an external audio signal. The received audio signal may be further stored in the memory 804 or may be sent via the communication component 816. The audio component 810 may further include a loudspeaker adapted to outputting the audio signal.

The I/O interface 812 may provide an interface between the processing component 802 and a peripheral interface module. Such a peripheral interface module may be a keypad, a click wheel, a button, etc. Such a button may include but is not limited to at least one of a homepage button, a volume button, a start button, or a lock button.

The sensor component 814 may include one or more sensors for assessing various states of the device 800. For example, the sensor component 814 may detect an on/off state of the device 800 and relative location of components such as the display and the keypad of the device 800. The sensor component 814 may further detect a change in the location of the device 800 or of a component of the device 800, whether there is contact between the device 800 and a user, the orientation or acceleration/deceleration of the device 800, a change in the temperature of the device 800, etc. The sensor component 814 may include a proximity sensor adapted to detecting existence of a nearby object without physical contact. The sensor component 814 may further include an optical sensor such as a Complementary Metal-Oxide-Semiconductor (CMOS) or a Charge-Coupled-Device (CCD) image sensor used in an imaging application. The sensor component 814 may further include an acceleration sensor, a gyroscope sensor, a magnetic sensor, a pressure sensor, a temperature sensor, etc.

The communication component 816 may be adapted to facilitating wired or wireless communication between the device 800 and other equipment. The device 800 may access a wireless network based on a communication standard such as Wi-Fi, 2G, 3G, . . . , or a combination thereof. The communication component 816 may broadcast related information or receive a broadcast signal from an external broadcast management system via a broadcast channel. The communication component 816 may include a Near Field Communication (NFC) module for short-range communication. For example, the NFC module may be based on technology such as Radio Frequency Identification (RFID), Infrared Data Association (IrDA), Ultra-Wideband (UWB) technology, Bluetooth (BT), etc.

The device 800 may be actualized by one or more electronic components such as an Application Specific Integrated Circuit (ASIC), a Digital Signal Processor (DSP), a Digital Signal Processing Device (DSPD), a Programmable Logic Device (PLD), a Field Programmable Gate Array (FPGA), a controller, a microcontroller, a microprocessor, etc., to implement an aforementioned method.

A non-transitory computer-readable storage medium including instructions, such as memory 804 including instructions, may be provided. The instructions may be executed by the processor 820 of the device 800 to implement an aforementioned method. For example, the non-transitory computer-readable storage medium may be Read-Only Memory (ROM), Random Access Memory (RAM), Compact Disc Read-Only Memory (CD-ROM), a magnetic tape, a floppy disk, optical data storage equipment, etc.

A non-transitory computer-readable storage medium has stored therein instructions which, when executed by a processor of electronic equipment, allow the electronic equipment to execute a method for identifying a battery according to an embodiment herein.

Further note that herein by "multiple," it may mean two or more. Other quantifiers may have similar meanings. A term "and/or" may describe an association between associated objects, indicating three possible relationships. For example, by A and/or B, it may mean that there may be three cases, namely, existence of but A, existence of both A and B, or existence of but B. A slash mark "I" may generally denote an "or" relationship between two associated objects that come respectively before and after the slash mark. Singulars "a/an," "said" and "the" are intended to include the plural form, unless expressly illustrated otherwise by context.

Further note that although in drawings herein operations are described in a specific or der, it should not be construed as that the operations have to be performed in the specific or der or sequence, or that any operation shown has to be performed in or der to acquire an expected result. Under a specific circumstance, multitask and parallel processing may be advantageous.

Other embodiments of the subject disclosure will be apparent to one skilled in the art after he/she has considered the subject disclosure and practiced the embodiments disclosed herein. The subject application is intended to cover any variation, use, or adaptation of the subject disclosure following the general principle of the subject disclosure and including such departures from the subject disclosure as come within known or customary practice in the art. The subject disclosure and its embodiments are intended to be examples only, with a true scope and spirit of the subject disclosure being indicated by the appended claims.

The subject disclosure is not limited to the exact construction that has been described above and illustrated in the accompanying drawings. Various modifications and changes can be made without departing from the scope of the subject disclosure. It is intended that the scope of the subject disclosure be limited only by the appended claims.

What is claimed is:

1. A method for identifying a battery, applied to electronic equipment provided with the battery, the battery comprising a cell under test, the method comprising:
    detecting an electrical parameter of the cell under test in the battery of the electronic equipment;
    determining a similarity between the cell under test and a preset cell according to a difference between the electrical parameter of the cell under test and a preset electrical parameter of the preset cell, or according to a ratio of the electrical parameter of the cell under test to a preset electrical parameter of the preset cell, the preset cell meeting a first preset matching relation with the electronic equipment, the first preset matching relation indicating that the preset cell is an original cell of the electronic equipment; and
    determining, according to the similarity, whether the cell under test meets the first preset matching relation with the electronic equipment, acquiring a determination result, wherein determining, according to the similarity, whether the cell under test meets the first preset matching relation with the electronic equipment comprises:
        in response to the similarity being no less than a preset threshold, acquiring a first determination result indicating that the cell under test meets the first preset matching relation with the electronic equipment; and
        in response to the similarity being less than the preset threshold, acquiring a second determination result indicating that the cell under test does not meet the first preset matching relation with the electronic equipment,
    wherein the battery comprises a battery protecting circuit under test, and the method further comprises:
    reading a first sequence from the battery protecting circuit under test; and
    in response to a failure to read the first sequence, determining that the battery protecting circuit under test does not meet a second preset matching relation with the electronic equipment.

2. The method of claim 1, wherein determining the similarity between the cell under test and the preset cell according to the difference between the electrical parameter of the cell under test and the preset electrical parameter of the preset cell, or the ratio of the electrical parameter of the cell under test to the preset electrical parameter of the preset cell comprises:
    determining a chemical parameter feature value of the cell under test according to the electrical parameter of the cell under test; and
    determining the similarity using a second similarity between the chemical parameter feature value of the cell under test and a chemical parameter feature value of the preset cell.

3. The method of claim 1, further comprising:
    acquiring a cycle number of the battery; and
    adjusting a value of the preset threshold according to the cycle number.

4. The method of claim 3, the battery further comprising a battery protecting circuit under test, the battery protecting circuit under test comprising a one-time burning counter, the method further comprising:
    acquiring a count in the one-time burning counter, the count indicating the cycle number of the battery.

5. The method of claim 1, further comprising:
    in response to the first sequence being read, generating a second sequence, wherein in response to the battery protecting circuit under test meeting the second preset matching relation with the electronic equipment, the battery protecting circuit under test generates the first sequence in a mode same as how a processing circuit of the electronic equipment generates the second sequence; and
    determining, according to the first sequence and the second sequence, whether the battery protecting circuit under test meets the second preset matching relation with the electronic equipment, acquiring a matching result.

6. The method of claim 5, wherein generating the second sequence comprises:
    generating the second sequence based on a cycle number of the preset cell and an identification of a preset battery protecting circuit.

7. The method of claim 5, wherein determining, according to the first sequence and the second sequence, whether the battery protecting circuit under test meets the second preset matching relation with the electronic equipment comprises:
    in response to the first sequence and the second sequence being identical, acquiring a first matching result indicating that the battery protecting circuit under test meets the second preset matching relation with the electronic equipment; and
    in response to the first sequence and the second sequence differing, acquiring a second matching result indicating that the battery protecting circuit under test does not meet the second preset matching relation with the electronic equipment.

8. The method of claim 5, further comprising:
    performing, according to at least one of the determination result or the matching result, Power Delivery (PD) for the battery in a mode meeting a PD safety condition of the battery.

9. The method of claim 8, wherein performing, according to the at least one of the determination result or the matching result, the PD for the battery in the mode meeting the PD safety condition of the battery comprises at least one of following acts:
    in response to the determination result indicating that the cell under test meets the first preset matching relation with the electronic equipment, and the matching result indicating that the battery protecting circuit under test meets the second preset matching relation with the electronic equipment, performing PD for the battery in a first mode;
    in response to the determination result indicating that the cell under test does not meet the first preset matching relation with the electronic equipment, performing PD for the battery in a second mode; or
    in response to the matching result indicating that the battery protecting circuit under test does not meet the second preset matching relation with the electronic equipment, performing PD for the battery in the second mode,
    wherein a delivery current in the second mode is less than a delivery current in the first mode.

10. The method of claim 5, further comprising at least one of following acts:
    in response to the determination result indicating that the cell under test does not meet the first preset matching relation with the electronic equipment, outputting a first state indication indicating an abnormality in the cell under test; or in response to the matching result indicating that the battery protecting circuit under test does not meet the second preset matching relation with the electronic equipment, outputting a second state indication indicating an abnormality in the battery protecting circuit under test.

11. Electronic equipment, the electronic equipment being provided with a battery and comprising:
one or more processors; and
a non-transitory computer-readable storage medium for storing instructions executable by the one or more processors,
wherein the one or more processors are adapted to identify the battery comprising a cell under test, and the one or more processors are further adapted to:
detect an electrical parameter of the cell under test;
determine a similarity between the cell under test and a preset cell according to a difference between the electrical parameter of the cell under test and a preset electrical parameter of the preset cell, or according to a ratio of the electrical parameter of the cell under test to a preset electrical parameter of the preset cell, the preset cell meeting a first preset matching relation with the electronic equipment, and the first preset matching relation indicating that the preset cell is an original cell of the electronic equipment; and
determine, according to the similarity, whether the cell under test meets the first preset matching relation with the electronic equipment, acquiring a determination result,
in response to the similarity being no less than a preset threshold, acquire a first determination result indicating that the cell under test meets the first preset matching relation with the electronic equipment;
in response to the similarity being less than the preset threshold, acquire a second determination result indicating that the cell under test does not meet the first preset matching relation with the electronic equipment;
read a first sequence from a battery protecting circuit under test of the battery; and
in response to a failure to read the first sequence, determine that the battery protecting circuit under test does not meet a second preset matching relation with the electronic equipment.

12. The electronic equipment of claim 11, wherein the one or more processors are further adapted to:
determine a chemical parameter feature value of the cell under test according to the electrical parameter of the cell under test; and
determine a similarity between the chemical parameter feature value of the cell under test and a chemical parameter feature value of the preset cell.

13. The electronic equipment of claim 11, wherein the one or more processors are further adapted to:
in response to the first sequence being read, generate a second sequence, wherein in response to the battery protecting circuit under test meeting the second preset matching relation with the electronic equipment, the battery protecting circuit under test generates the first sequence in a mode same as how a processing circuit of the electronic equipment generates the second sequence; and determine, according to the first sequence and the second sequence, whether the battery protecting circuit under test meets the second preset matching relation with the electronic equipment, acquiring a matching result.

14. A battery to be identified using the method of claim 1, the battery comprising
a cell; and
a battery protecting circuit,
wherein the cell is adapted to store electric energy,
wherein the battery protecting circuit is adapted to protect the cell,
wherein the battery protecting circuit comprises a one-time burning counter adapted to determine a count indicating a cycle number of the battery.

15. The battery of claim 14, wherein the battery protecting circuit further comprises an encrypting circuit,
wherein the encrypting circuit is electrically connected to the one-time burning counter, wherein the encrypting circuit is adapted to acquiring the cycle number and an identification of the battery protecting circuit, and encrypting the cycle number and the identification of the battery protecting circuit using a preset algorithm, generating a first sequence,
wherein the first sequence is compared to a second sequence generated by electronic equipment using the battery based on a cycle number of a preset cell and an identification of a preset battery protecting circuit stored in the electronic equipment, to determine whether the battery protecting circuit meets a second preset matching relation with the electronic equipment, the preset battery protecting circuit meeting the second preset matching relation with the electronic equipment.

16. A non-transitory computer-readable storage medium, having a plurality of programs for execution by electronic equipment having one or more processors and being provided with a battery comprising a cell under test, wherein the plurality of programs, when executed by the one or more processors, cause the electronic equipment to perform acts comprising:
detecting an electrical parameter of the cell under test;
determining a similarity between the cell under test and a preset cell according to a difference between the electrical parameter of the cell under test and a preset electrical parameter of the preset cell, or according to a ratio of the electrical parameter of the cell under test to a preset electrical parameter of the preset cell, the preset cell meeting a first preset matching relation with the electronic equipment, the first preset matching relation indicating that the preset cell is an original cell of the electronic equipment;
determining, according to the similarity, whether the cell under test meets the first preset matching relation with the electronic equipment, acquiring a determination result, comprising:
in response to the similarity being no less than a preset threshold, acquiring a first determination result indicating that the cell under test meets the first preset matching relation with the electronic equipment; and
in response to the similarity being less than the preset threshold, acquiring a second determination result indicating that the cell under test does not meet the first preset matching relation with the electronic equipment;
reading a first sequence from a battery protecting circuit under test; and in response to a failure to read the first sequence, determining that the battery protecting circuit under test does not meet a second preset matching relation with the electronic equipment.

* * * * *